United States Patent
Ariyama

(10) Patent No.: US 10,006,971 B2
(45) Date of Patent: Jun. 26, 2018

(54) DETECTION DEVICE

(71) Applicant: SII Semiconductor Corporation, Chiba-shi, Chiba (JP)

(72) Inventor: Minoru Ariyama, Chiba (JP)

(73) Assignee: ABLIC INC., Chiba (JP)

( * ) Notice: Subject to any disclaimer, the term of this patent is extended or adjusted under 35 U.S.C. 154(b) by 118 days.

(21) Appl. No.: 15/091,784

(22) Filed: Apr. 6, 2016

(65) Prior Publication Data

US 2016/0216339 A1 Jul. 28, 2016

Related U.S. Application Data

(63) Continuation of application No. PCT/JP2014/073080, filed on Sep. 2, 2014.

(30) Foreign Application Priority Data

Oct. 9, 2013 (JP) .................................. 2013-212173

(51) Int. Cl.
*G01R 33/06* (2006.01)
*G01R 33/00* (2006.01)
*G01D 21/00* (2006.01)
*G01R 33/02* (2006.01)
*G01D 3/10* (2006.01)

(52) U.S. Cl.
CPC ........... *G01R 33/0023* (2013.01); *G01D 3/10* (2013.01); *G01D 21/00* (2013.01); *G01R 33/02* (2013.01)

(58) Field of Classification Search
CPC ................................................ G01R 33/0023
USPC ........................................................ 324/244
See application file for complete search history.

(56) References Cited

U.S. PATENT DOCUMENTS

| | | | | |
|---|---|---|---|---|
| 7,696,771 B2* | 4/2010 | Tanaka | ............. | G01R 31/31721 324/764.01 |
| 8,698,505 B2* | 4/2014 | Suzuki | ..................... | G01D 3/08 324/511 |
| 2008/0048772 A1 | 2/2008 | Nishikawa | | |

FOREIGN PATENT DOCUMENTS

| | | |
|---|---|---|
| JP | 2007-156997 A | 6/2007 |
| JP | 2007-318352 A | 12/2007 |
| JP | 2009-38246 A | 2/2009 |
| JP | 2012-63211 A | 3/2012 |

OTHER PUBLICATIONS

English translation of Written Opinion and International Search Report in corresponding International Application No. PCT/JP2014/073080, dated Dec. 9, 2014, 7 pages.
Extended Search Report in corresponding European Application No. 14852591.8, dated Jul. 20, 2017, 7 pages.

* cited by examiner

*Primary Examiner* — Reena Aurora
(74) *Attorney, Agent, or Firm* — Brinks Gilson & Lione

(57) ABSTRACT

Disclosed is a current output-type detection device capable of reducing an amount of power consumption without sacrificing detection accuracy. The detection device includes: a sensor circuit; a sensor signal processing circuit that outputs a detection signal upon receiving a signal of a detection result of the sensor circuit; and a control circuit that outputs control signals to the sensor circuit and the sensor signal processing circuit and receives the detection signal from the sensor signal processing circuit, configured in that the sensor circuit and the sensor signal processing circuit operate intermittently by the control signals from the control circuit.

4 Claims, 4 Drawing Sheets

DETECTION DEVICE

RELATED APPLICATIONS

The present application is a continuation of International Application PCT/JP2014/073080, with an international filing date of Sep. 2, 2014, which claims priority to Japanese Patent Application No. 2013-212173 filed on Oct. 9, 2013, the entire contents of which are incorporated herein by reference.

BACKGROUND OF THE INVENTION

Field of the Invention

The present invention relates to a current output-type detection device that changes an amount of current consumption of the device itself in response to a detection result.

Background Art

For example, in a current output-type detection device that changes an amount of current consumption of the device itself in response to a detection result of a magnetic sensor or the like, it is important, while suppressing an increase of an amount of power consumption, to suppress lowering of detection accuracy even if variations occur in a power supply voltage (for example, refer to Patent Document 1).

FIG. 8 illustrates a block diagram of a conventional current output-type detection device. The conventional current output-type detection device 1 is composed of: a detection circuit unit 4 composed of a magnetic detection element and the like; and a starting function unit 5 that starts up the detection circuit unit 4. In the detection device 1, an anode side of a power supply source 2 is connected to a power supply terminal Vcc thereof, and a cathode side of the power supply source 2 is connected to a ground terminal Vss thereof through a measuring resistor R. A measurement unit 3 is connected in parallel to both ends of the measuring resistor R.

The starting function unit 5 functions as a constant current source that supplies a constant current In to the detection circuit unit 4, and the starting function unit 5 itself flows a starting current Is therefrom. The detection circuit unit 4 starts up by the constant current In supplied from the starting function unit 5, and outputs a detection current Ix that shows a detection result. Hence, a current consumption I of the detection device 1 becomes a total sum of the starting current Is and the detection current Ix. Therefore, the measurement unit 3 can recognize the detection result by measuring this current consumption I.

Here, with regard to the detection device 1, a power supply circuit unit and a current stabilization circuit unit are provided between the starting function unit 5 and the detection circuit unit 4, whereby fluctuation of the current consumption of the detection device, the fluctuation being caused by the variations of the power supply voltage, is suppressed, and the detection device 1 becomes capable of obtaining the detection result with high accuracy. Hence, current values of the starting current Is and the detection current Ix can be set low, and accordingly, the detection device 1 can reduce an amount of power consumption.

[Patent Document 1] Japanese Patent Application Laid-Open No. 2007-156997

SUMMARY OF THE INVENTION

However, the starting current Is of the starting function unit 5 always flows through the conventional current output-type detection device 1, and accordingly, the conventional current output-type detection device 1 cannot cope with further reduction of the amount of power consumption.

The present invention has been invented in order to solve such a problem as described above. The present invention provides a current output-type detection device capable of reducing the amount of power consumption without sacrificing the detection accuracy.

In order to solve the conventional problem, the current output-type detection device of the present invention includes: a sensor circuit; a sensor signal processing circuit that outputs a detection signal upon receiving a signal of a detection result of the sensor circuit; and a control circuit that outputs control signals to the sensor circuit and the sensor signal processing circuit and receives the detection signal from the sensor signal processing circuit, configured in that the sensor circuit and the sensor signal processing circuit operate intermittently by the control signals from the control circuit.

In accordance with the current output-type detection device of the present invention, the detection device is configured so that the control circuit 11 can drive the sensor circuit 12 and the sensor signal processing circuit 13 intermittently, and accordingly, the detection device has an effect of being capable of reducing the current consumption without sacrificing the detection accuracy in comparison with the conventional technology.

DETAILED DESCRIPTION OF THE PREFERRED EMBODIMENTS

A description is made below of a current output-type detection device of the present invention with reference to the drawings.

First Embodiment

Figure 1:
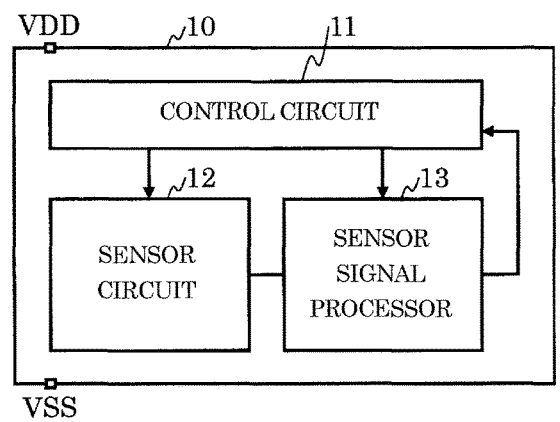
FIG. 1 is a block diagram illustrating a current output-type detection device of a first embodiment.

FIG. 1 is a block diagram illustrating a current output-type detection device 10 of a first embodiment.

The current output-type detection device 10 of this embodiment includes: a control circuit 11; a sensor circuit 12; and a sensor signal processing circuit 13.

The control circuit 11 outputs control signals to the sensor circuit 12 and the sensor signal processing circuit 13, and receives a detection signal from the sensor signal processing circuit 13. Upon receiving the control signal from the control circuit 11, the sensor circuit 12 starts up and performs a detection operation. Upon receiving the control signal from the control circuit 11, the sensor signal processing circuit 13 starts up and outputs a detection signal in response to a detection result of the sensor circuit 12.

Figure 2:
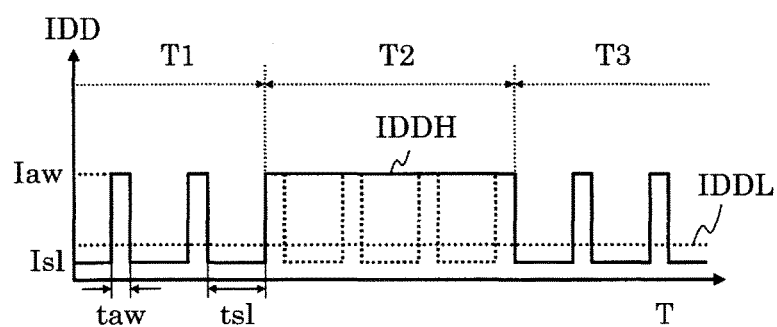
FIG. 2 is a chart illustrating a relationship between operations and current consumption of the current output-type detection device of the first embodiment.

Next, a description is made of operations of the current output-type detection device of this embodiment. FIG. 2 is a chart illustrating a relationship between the operations and current consumption of the current output-type detection device 10 of the first embodiment.

For example, the control circuit 11 includes an oscillation circuit and a counter, outputs the control signals intermittently, and starts up the sensor circuit 12 and the sensor signal processing circuit 13. A state that the sensor circuit 12 and the sensor signal processing circuit 13 are stopped is defined as a sleep state ts1, and a state that the sensor circuit 12 and the sensor signal processing circuit 13 are started is defined as an awake state taw. Only the control circuit 11 operates in the sleep state ts1, and accordingly, a current consumption of the detection device 10 is a sleep current Is1. All of the circuits operate in the awake state taw, and accordingly, the current consumption of the detection device 10 is an awake current Iaw.

The period T1 is a non-detection period while a physical quantity to be detected by the sensor circuit 12 does not reach a detection level. The sensor circuit 12 does not output the detection signal to the control circuit 11 through the sensor signal processing circuit 13. Hence, the detection device 10 repeats the sleep state ts1 and the awake state taw. In this non-detection period T1, the current consumption of the detection device 10 is IDDL.

The period T2 is a detection period while the physical quantity to be detected by the sensor circuit 12 has reached the detection level. The sensor circuit 12 outputs the detection signal to the control circuit 11 through the sensor signal processing circuit 13. During a period of receiving the detection signal, the control circuit 11 outputs the control signals to the sensor circuit 12 and the sensor signal processing circuit 13, and maintains the awake current Iaw. At this time, the sensor circuit 12 performs an intermittent operation in a similar way to the non-detection period T1. In this detection period T2, the current consumption of the detection device 10 is IDDH.

In a non-detection period T3 while the physical quantity to be detected by the sensor circuit 12 has no longer reached the detection level, the detection device 10 repeats the sleep state ts1 and the awake state taw one more time, and the current consumption becomes IDDL.

Figure 6:
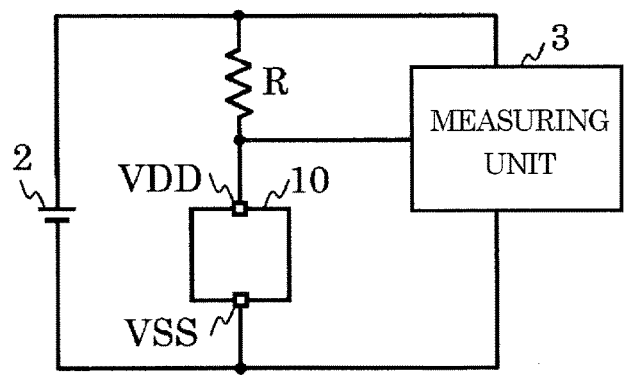
FIG. 6 is a block diagram illustrating an example of a sensor system including the current output-type detection device of the present invention.

FIG. 6 is a block diagram illustrating an example of a sensor system including the current output-type detection device 10 of the present invention. The sensor system includes: the detection device 10; a power supply source 2; a measurement unit 3; and a measuring resistor R. The measurement unit 3 measures a voltage between both ends of the measuring resistor R, and determines the detection result of the detection device 10. The detection device 10 of this embodiment shows the detection result by the current consumption that is as illustrated in FIG. 2. Accordingly, the measurement unit 3 may be configured to determine that the detection signal is outputted, for example, upon measuring that the voltage is a detection voltage VDDH during a fixed period. The detection voltage VDDH is a voltage when the awake current Iaw flows through the measuring resistor R.

Figure 7:
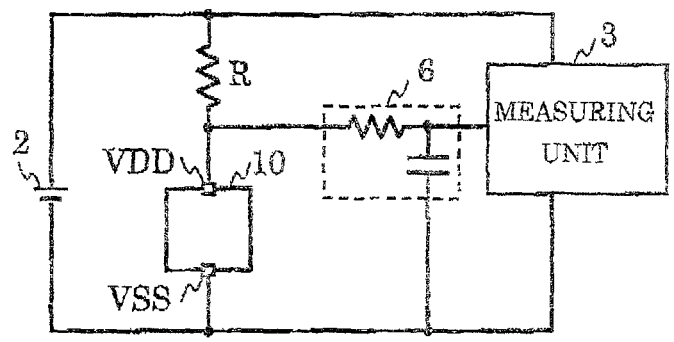
FIG. 7 is a block diagram illustrating another example of the sensor system including the current output-type detection device of the present invention.
Figure 8:
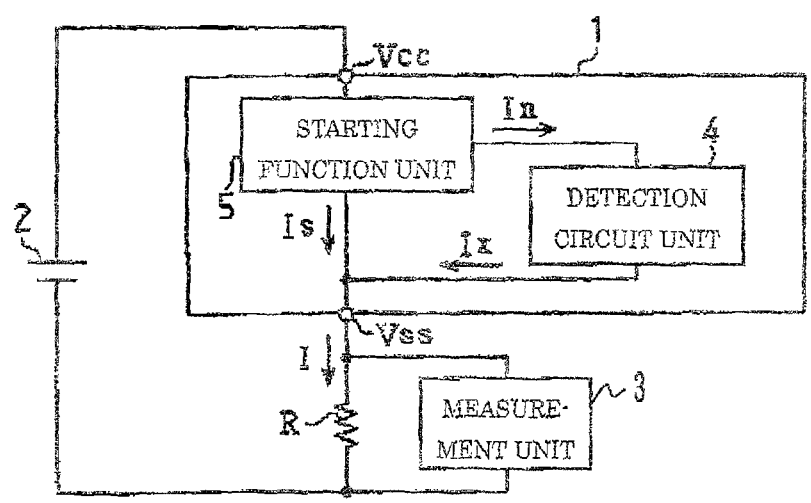
FIG. 8 is a block diagram illustrating a conventional current output-type detection device.

FIG. 7 is a block diagram illustrating another example of the sensor system including the current output-type detection device 10 of the present invention. The sensor system further includes a filter circuit 6. The filter circuit 6 makes a setting so that a waveform of repetition of the sleep current Is1 and the awake current Iaw at the time of the non-detection period can be a non-detection current IDDL. Hence, the measurement unit 3 can determine whether a type of the signal thus received is the detection signal or a non-detection signal based on whether or not the measured voltage is the detection voltage VDDH or a non-detection voltage VDDL. The non-detection voltage VDDL is a voltage when the sleep current Is1 and the awake current Iaw flow through the measuring resistor R alternately.

As described above, the current output-type detection device 10 of this embodiment is configured so that the control circuit 11 can drive the sensor circuit 12 and the sensor signal processing circuit 13 intermittently, and accordingly, is made capable of reducing the amount of power consumption without sacrificing the detection accuracy in comparison with the conventional technology.

Note that, though the current output-type detection device 10 of this embodiment is described as a configuration that intermittently operates in the detection period T2 in a similar way to the non-detection periods T1 and T3, the current output-type detection device 10 of this embodiment may be configured to continuously detect a detection current. In such a way, the current output-type detection device 10 can be turned to a non-detection state early, and accordingly, the current output-type detection device 10 can further reduce the current consumption.

Second Embodiment

Figure 3:
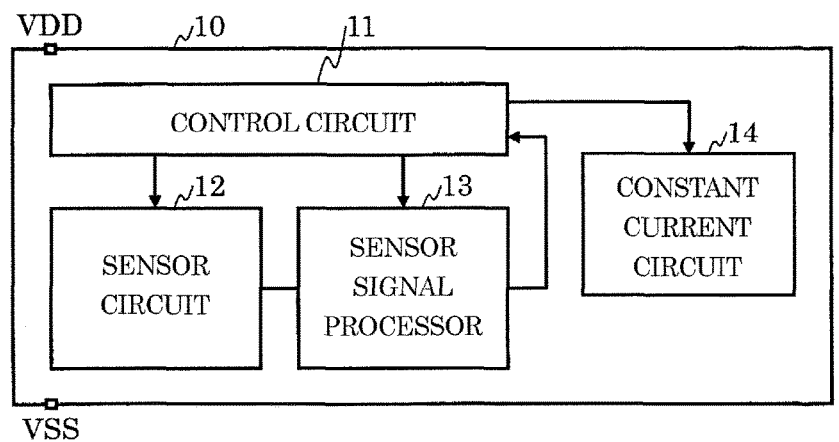
FIG. 3 is a block diagram illustrating a current output-type detection device of a second embodiment.

FIG. 3 is a block diagram illustrating a current output-type detection device 10 of a second embodiment.

The current output-type detection device 10 of this embodiment includes: a control circuit 11; a sensor circuit 12; a sensor signal processing circuit 13; and a constant current circuit 14.

The control circuit 11 outputs control signals to the sensor circuit 12, the sensor signal processing circuit 13 and the constant current circuit 14, and receives a detection signal from the sensor signal processing circuit 13. Upon receiving the control signal from the control circuit 11, the sensor circuit 12 starts up and performs a detection operation. Upon receiving the control signal from the control circuit 11, the sensor signal processing circuit 13 starts up and outputs a detection signal in response to a detection result of the sensor circuit 12. Upon receiving the control signal, the constant current circuit 14 flows a constant current therefrom, and increases a current consumption of the detection device 10.

Next, a description is made of operations of the current output-type detection device of this embodiment.

Figure 4:
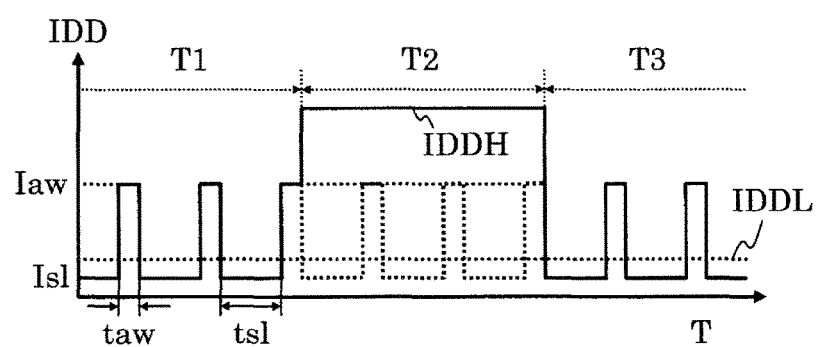
FIG. 4 is a chart illustrating an example of a relationship between operations and current consumption of the current output-type detection device of the second embodiment.

FIG. 4 is a chart illustrating a relationship between the operations and current consumption of the current output-type detection device 10 of this embodiment.

Operations of the detection device 10 in the non-detection period T1 are similar to those of the first embodiment.

In the detection period T2, during a period of receiving the detection signal, the control circuit 11 outputs the control signals to the sensor circuit 12 and the sensor signal processing circuit 13, and maintains the awake current Iaw. Moreover, during the period of receiving the detection signal, the control circuit 11 outputs the control signal to the constant current circuit 14. Upon receiving the control signal, the constant current circuit 14 flows a constant current therefrom, and increases the current consumption of the detection device 10. The current consumption of the detection device 10 is a current IDDH obtained by adding the constant current of the constant current circuit 14 to the awake current Iaw.

When the current output-type detection device 10 is configured as described above, erroneous detection by the measurement unit 3 decreases, and accordingly, the current consumption of the sensor system is reduced, and in addition, reliability thereof is enhanced.

Note that, though the current output-type detection device 10 of this embodiment is described as a configuration that intermittently operates in the detection period T2 in a similar way to the non-detection periods T1 and T3, the current output-type detection device 10 of this embodiment may be configured to continuously detect the detection current. In such a way, the current output-type detection device 10 can be turned to the non-detection state early, and accordingly, the current output-type detection device 10 can reduce the current consumption.

Figure 5:
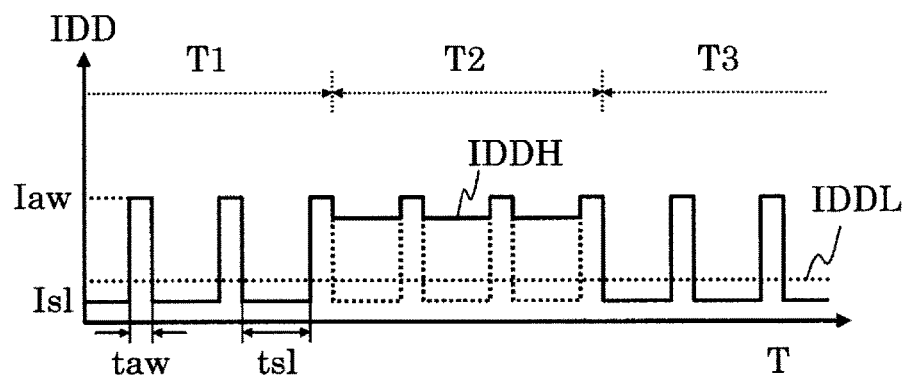
FIG. 5 is a chart illustrating another example of the relationship between the operations and current consumption of the current output-type detection device of the second embodiment.

FIG. 5 is a chart illustrating another example of the relationship between the operations and current consumption of the current output-type detection device 10 of this embodiment.

Operations of the detection device 10 in the non-detection period T1 are similar to those of the first embodiment.

In the detection period T2, for example, during the period of receiving the detection signal, the control circuit 11 outputs the control signal only to the sensor circuit 12, and flows only the current of the sensor circuit 12. Moreover, during the period of receiving the detection signal, the control circuit 11 outputs the control signal to the constant current circuit 14. Hence, the current consumption of the detection device 10 is the current IDDH obtained by adding the constant current of the constant current circuit 14 to the current of the sensor circuit 12.

When the current output-type detection device 10 is configured as described above, the current consumption of the sensor system can be further reduced.

As described above, in accordance with the current output-type detection device 10 of the present invention, the current consumption can be reduced in comparison with the conventional technology.

Moreover, it is possible to set the detection current IDDH and the non-detection current IDDL in response to a capability of the measurement unit 3, and accordingly, the current consumption of the sensor system can be reduced, and the reliability thereof can be enhanced.

Note that, though the current output-type detection device 10 of the present invention is described as a configuration that flows the current IDDH as the detection current in the detection period T2, the current IDDL may be used as the detection current. In such a way, the current consumption can be reduced in a case of a system in which the detection period is long and the non-detection period is short.

What is claimed is:

1. A current output-type detection device that changes an amount of current consumption of the device itself in response to a detection result, the detection device comprising:
    a sensor circuit that detects a physical quantity to be detected;
    a sensor signal processing circuit that outputs a detection signal upon receiving a signal of a detection result from the sensor circuit; and
    a control circuit that outputs control signals to the sensor circuit and the sensor signal processing circuit and receives the detection signal from the sensor signal processing circuit,
    wherein the sensor circuit and the sensor signal processing circuit operate intermittently in response to the control signals.

2. The detection device according to claim 1, wherein the control circuit outputs the control signal to at least either one of the sensor circuit and the sensor signal processing circuit during a period of receiving the detection signal from the sensor signal processing circuit, and increases the current consumption of the detection device.

3. The detection device according to claim 1, wherein the control circuit outputs the control signal to at least either one of the sensor circuit and the sensor signal processing circuit during a period of not receiving the detection signal from the sensor signal processing circuit, and increases the current consumption of the detection device.

4. A current output-type detection device that changes an amount of current consumption of the device itself in response to a detection result, the detection device comprising:
    a sensor circuit that detects a physical quantity to be detected;
    a sensor signal processing circuit that outputs a detection signal upon receiving a signal of a detection result from the sensor circuit; and
    a control circuit that outputs control signals to the sensor circuit and the sensor signal processing circuit and receives the detection signal from the sensor signal processing circuit,
    wherein the sensor circuit and the sensor signal processing circuit operate intermittently in response to the control signals; and
    a constant current circuit,
    wherein the constant current circuit flows a constant current therefrom in response to a control signal from the control circuit and increases the current consumption of the detection device.

* * * * *